United States Patent
Zhang et al.

(10) Patent No.: US 10,373,841 B2
(45) Date of Patent: Aug. 6, 2019

(54) PHOTOMASK MANUFACTURING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Hai Yang Zhang, Shanghai (CN); Yan Wang, Shanghai (CN)

(73) Assignees: SEMICONDUCTOR MANUFACTURING INTERNATIONAL (BEIJING) CORPORATION (CN); SEMICONDUCTOR MANUFACTURING INTERNATIONAL (SHANGHAI) CORPORATION (CN)

( * ) Notice: Subject to any disclaimer, the term of this patent is extended or adjusted under 35 U.S.C. 154(b) by 0 days.

(21) Appl. No.: 15/816,673

(22) Filed: Nov. 17, 2017

(65) Prior Publication Data

US 2018/0144947 A1    May 24, 2018

(30) Foreign Application Priority Data

Nov. 23, 2016    (CN) .......................... 2016 1 1046349

(51) Int. Cl.
*H01L 21/308*    (2006.01)
*H01L 21/467*    (2006.01)
(Continued)

(52) U.S. Cl.
CPC ...... *H01L 21/3088* (2013.01); *G03F 7/70425* (2013.01); *H01L 21/3081* (2013.01);
(Continued)

(58) Field of Classification Search
CPC ............... H01L 21/027; H01L 21/0337; H01L 21/0338; H01L 21/3081; H01L 21/3086;
(Continued)

(56) References Cited

U.S. PATENT DOCUMENTS 8,003,543 B2 * 8/2011 Koh ..................... H01L 21/0337
438/551
8,871,651 B1 * 10/2014 Choi ................. H01L 29/66795
216/12
(Continued)

FOREIGN PATENT DOCUMENTS

CN            104900495 A        9/2015

OTHER PUBLICATIONS

Simon Ruffell, et al., "Directed Ribbon-beam capability for novel etching applications", J. Vac. Sci. Technol. B 33 06FA02-1, (2015) 6 pages.
(Continued)

*Primary Examiner* — Stephen W Smoot
(74) *Attorney, Agent, or Firm* — Innovation Counsel LLP

(57) ABSTRACT

A photomask manufacturing method relating to semiconductor technology is presented. The manufacturing method involves providing a substrate structure comprising an etch material layer, a first sacrificial layer on a portion of the etch material layer, and a photomask layer on an upper surface of the etch material layer and on an upper surface and a side surface of the first sacrificial layer; forming a second sacrificial layer covering the photomask layer on the etch material layer and on the side surface of the first sacrificial layer; etching the photomask layer not covered by the second sacrificial layer to expose the first sacrificial layer; removing the first sacrificial layer and the second sacrificial layer; and removing the photomask layer on the etch material layer. This photomask manufacturing method offers a
(Continued)

photomask of better symmetricity than those from conventional methods.

11 Claims, 8 Drawing Sheets

(51) Int. Cl.
 *G03F 7/20* (2006.01)
 *H01L 29/78* (2006.01)
(52) U.S. Cl.
 CPC ...... *H01L 21/3085* (2013.01); *H01L 21/3086* (2013.01); *H01L 21/467* (2013.01); *H01L 29/785* (2013.01)
(58) Field of Classification Search
 CPC ... H01L 21/3088; H01L 21/32; H01L 21/467; G03F 1/80; G03F 7/0035; B81C 1/00396; B81C 1/00404; B81C 2201/0159; B81C 2201/0198
 See application file for complete search history.

(56) References Cited

U.S. PATENT DOCUMENTS

| | | | |
|---|---|---|---|
| 9,343,326 B2* | 5/2016 | Kim | C09K 3/1463 |
| 2007/0148968 A1* | 6/2007 | Kwon | H01L 21/0337 |
| | | | 438/671 |
| 2008/0076070 A1* | 3/2008 | Koh | H01L 21/0273 |
| | | | 430/311 |
| 2008/0097729 A1* | 4/2008 | Jung | G03F 1/36 |
| | | | 703/1 |
| 2008/0113511 A1 | 5/2008 | Park et al. | |
| 2009/0047788 A1* | 2/2009 | Jung | H01L 21/0337 |
| | | | 438/694 |
| 2009/0068838 A1 | 3/2009 | Kim et al. | |

OTHER PUBLICATIONS

European Search Report corresponding to EP17202960, dated Apr. 16, 2018, 1 page.

* cited by examiner

PHOTOMASK MANUFACTURING METHOD

CROSS-REFERENCE TO RELATED APPLICATION

This application claims priority to and benefit of Chinese Patent Application No. 201611046349.4 filed on Nov. 23, 2016, which is incorporated herein by reference in its entirety.

BACKGROUND (a) Field of the Invention

This inventive concept relates to semiconductor technology, or more specifically, a photomask manufacturing method.

(b) Description of the Related Art

As the critical dimension of semiconductor devices decreases, it is becoming increasingly difficult to use lithography technique to manufacture a photomask of small critical dimension. To further increase the integration level of semiconductor devices, double patterning techniques, such as Self-Aligned Double Patterning (SADP), have been proposed for photomask manufacture.

FIGS. 1A, 1B, and 1C show schematic sectional views illustrating a conventional photomask manufacturing method.

Referring to FIG. 1A, in a conventional manufacturing method, an etch material layer 102 is first formed on a substrate 101, then a sacrificial layer 103 is formed on the etch material layer 102, and a photomask layer 104 is formed on an upper surface of the etch material layer 102 and on an upper surface and an side surface of the sacrificial layer 103.

Referring to FIG. 1B, the photomask layer 104 on the etch material layer 102 and the sacrificial layer 103 is etched away, while the photomask layer 104 on the side surface of the sacrificial layer 103 is retained.

Referring to FIG. 1C, the sacrificial layer 103 is removed and the remaining photomask layer 104 is retained and becomes the photomask 114.

The photomask 114 manufactured by this conventional method has an asymmetrical shape. As shown in FIG. 1C, it has a straight side on one side but a curved side on the other. If this photomask is used to etch the etch material layer 102, different amount of the etch material layer 102 will be etched on two sides of the photomask 114, which will result in an asymmetrical surface on two sides of the photomask 114. Hence a photomask manufacturing method that can remedy this shortcoming is desirable.

SUMMARY

This inventive concept presents a photomask manufacturing method that offers a photomask of better symmetry than those from conventional methods.

This photomask manufacturing method comprises:
providing a substrate structure, wherein the substrate structure comprises:
an etch material layer;
a first sacrificial layer on a portion of the etch material layer; and
a photomask layer on an upper surface of the etch material layer, an upper surface of the first sacrificial layer, and a side surface of the first sacrificial layer;
forming a second sacrificial layer covering the photomask layer on the etch material layer and the photomask layer on the side surface of the first sacrificial layer;
etching the photomask layer not covered by the second sacrificial layer to expose the first sacrificial layer;
removing the first sacrificial layer and the second sacrificial layer; and
removing the photomask layer on the etch material layer.

Additionally, in the aforementioned method, forming a second sacrificial layer may comprise:
depositing a sacrificial material layer on the substrate structure; and
conducting a planarization process on the sacrificial material layer so that an upper surface of the remaining sacrificial material layer is on a substantially same horizontal level with an upper surface of the photomask layer on the first sacrificial layer, the remaining sacrificial material layer is the second sacrificial layer.

Additionally, in the aforementioned method, forming a second sacrificial layer may comprise:
depositing a sacrificial material layer on the substrate structure; and
conducting an etch-back process on the sacrificial material layer so that an upper surface of the remaining sacrificial material layer is on a substantially same horizontal level with an upper surface of the photomask layer on the first sacrificial layer, the remaining sacrificial material layer is the second sacrificial layer.

Additionally, in the aforementioned method, the photomask layer on the etch material layer may be removed by Directed Plasma Ribbon Etch or by an etch-back process.

Additionally, in the aforementioned method, the side surface of the first sacrificial layer may comprise a first side, a second side opposite to the first side, a third side, and a fourth side opposite to the third side, and the aforementioned method may further comprise:
removing the photomask layer on either the first and the second sides, or the third and the fourth sides of the first sacrificial layer.

Additionally, in the aforementioned method, the photomask layer on either the first and the second sides, or the third and the fourth sides of the first sacrificial layer may be removed by Directed Plasma Ribbon Etch.

Additionally, in the aforementioned method, the etch material layer may comprise a semiconductor substrate and a hard mask layer on the semiconductor substrate.

Additionally, the aforementioned method may further comprise:
forming a patterned hard mask layer by etching the hard mask layer using the remaining photomask layer as a mask; and
etching the semiconductor substrate using the patterned hard mask layer as a mask.

Additionally, the aforementioned method may further comprise etching the etch material layer using the remaining photomask layer as a mask.

Additionally, in the aforementioned method, the first sacrificial layer and the second sacrificial layer may be made of a same material.

Additionally, in the aforementioned method, the first sacrificial layer and the second sacrificial layer may both be made of poly-silicon, and the photomask layer may be made of a silicon nitride, a silicon oxide, or a silicon nitrogen.

BRIEF DESCRIPTION OF THE DRAWINGS

The drawings illustrate some embodiments of this inventive concept and will be used to describe this inventive concept along with the specification.

DETAILED DESCRIPTION OF THE EMBODIMENTS

Figure 1A:
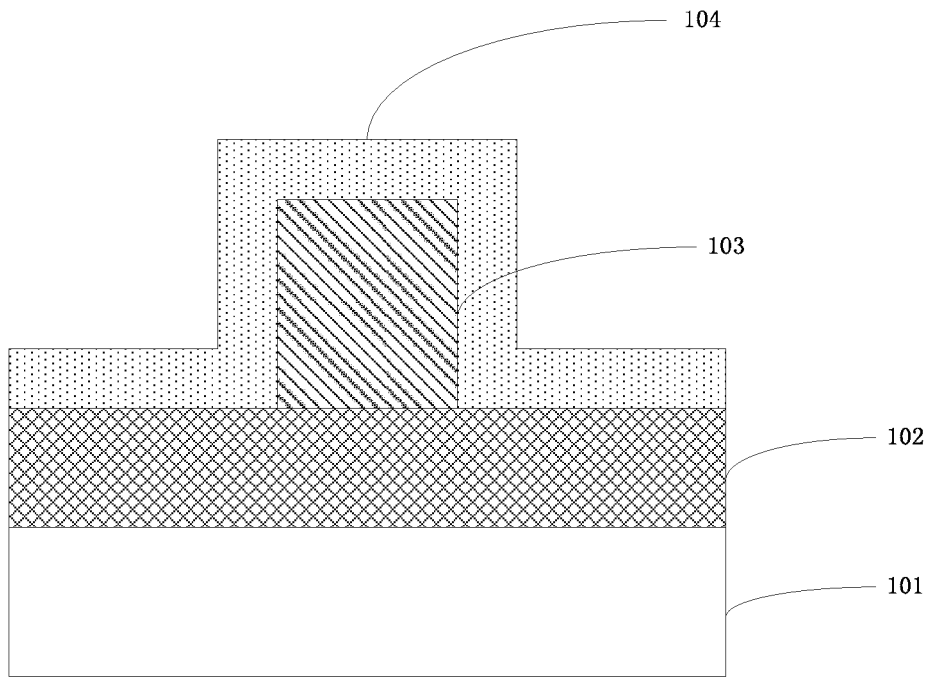
FIGS. 1A, 1B, and 1C show schematic sectional views illustrating a conventional photomask manufacturing method.

Example embodiments of the inventive concept are described with reference to the accompanying drawings. As those skilled in the art would realize, the described embodiments may be modified in various ways without departing from the spirit or scope of the inventive concept. Embodiments may be practiced without some or all of these specified details. Well known process steps and/or structures may not be described in detail, in the interest of clarity.

The drawings and descriptions are illustrative and not restrictive. Like reference numerals may designate like (e.g., analogous or identical) elements in the specification. To the extent possible, any repetitive description will be minimized.

Relative sizes and thicknesses of elements shown in the drawings are chosen to facilitate description and understanding, without limiting the inventive concept. In the drawings, the thicknesses of some layers, films, panels, regions, etc., may be exaggerated for clarity.

Embodiments in the figures may represent idealized illustrations. Variations from the shapes illustrated may be possible, for example due to manufacturing techniques and/or tolerances. Thus, the example embodiments shall not be construed as limited to the shapes or regions illustrated herein but are to include deviations in the shapes. For example, an etched region illustrated as a rectangle may have rounded or curved features. The shapes and regions illustrated in the figures are illustrative and shall not limit the scope of the embodiments.

Although the terms "first," "second," etc. may be used herein to describe various elements, these elements shall not be limited by these terms. These terms may be used to distinguish one element from another element. Thus, a first element discussed below may be termed a second element without departing from the teachings of the present inventive concept. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

If a first element (such as a layer, film, region, or substrate) is referred to as being "on," "neighboring," "connected to," or "coupled with" a second element, then the first element can be directly on, directly neighboring, directly connected to or directly coupled with the second element, or an intervening element may also be present between the first element and the second element. If a first element is referred to as being "directly on," "directly neighboring," "directly connected to," or "directly coupled with" a second element, then no intended intervening element (except environmental elements such as air) may also be present between the first element and the second element.

Spatially relative terms, such as "beneath," "below," "lower," "above," "upper," and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientation), and the spatially relative descriptors used herein shall be interpreted accordingly.

The terminology used herein is for the purpose of describing particular embodiments and is not intended to limit the inventive concept. As used herein, singular forms, "a," "an," and "the" may indicate plural forms as well, unless the context clearly indicates otherwise. The terms "includes" and/or "including," when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as what is commonly understood by one of ordinary skill in the art related to this field. Terms, such as those defined in commonly used dictionaries, shall be interpreted as having meanings that are consistent with their meanings in the context of the relevant art and shall not be interpreted in an idealized or overly formal sense unless expressly so defined herein.

The term "connect" may mean "electrically connect." The term "insulate" may mean "electrically insulate."

Unless explicitly described to the contrary, the word "comprise" and variations such as "comprises," "comprising," "include," or "including" may imply the inclusion of stated elements but not the exclusion of other elements.

Various embodiments, including methods and techniques, are described in this disclosure. Embodiments of the inventive concept may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the inventive concept may also cover apparatuses for practicing embodiments of the inventive concept. Such apparatus may include circuits, dedicated and/or programmable, to carry out operations pertaining to embodiments of the inventive concept. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the inventive concept.

Figure 1B:
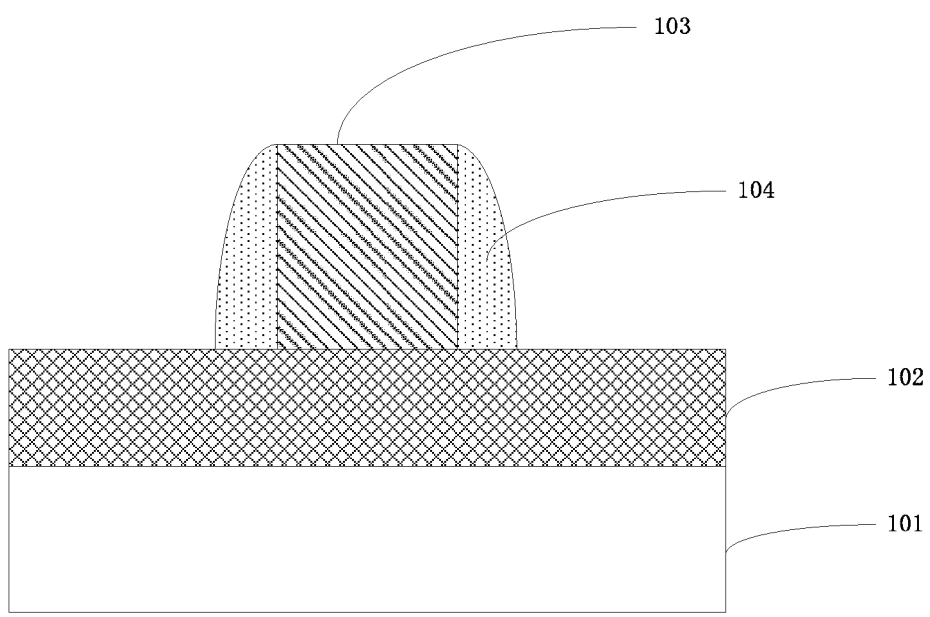
Figure 1C:
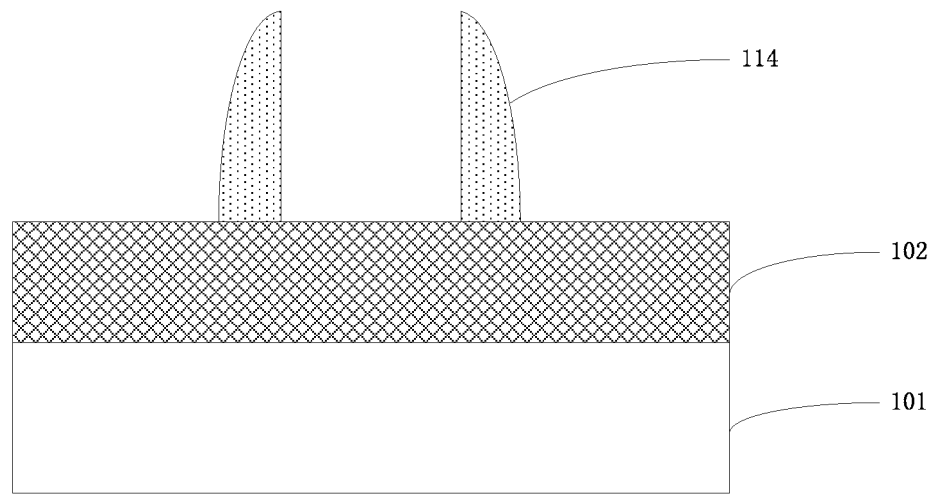

Referring to FIGS. 1A, 1B, and 1C, in conventional photomask manufacturing methods, the photomask 114 has an asymmetric shape because the sacrificial layer 103 only exists on one side of the photomask layer 104 and not on the other, as shown in FIG. 1B. When the photomask layer 104 on the sacrificial layer 103 and the etch material layer 102 is removed, the photomask layer 104 on the side surface of the sacrificial layer 103 will also be partially etched, and it will be etched less on a side neighboring the sacrificial layer 103 than the opposite side, which results in an asymmetric photomask 114. This inventive concept presents a photomask manufacturing method that can provide a more symmetrical photomask than those from conventional methods.

Figure 2:
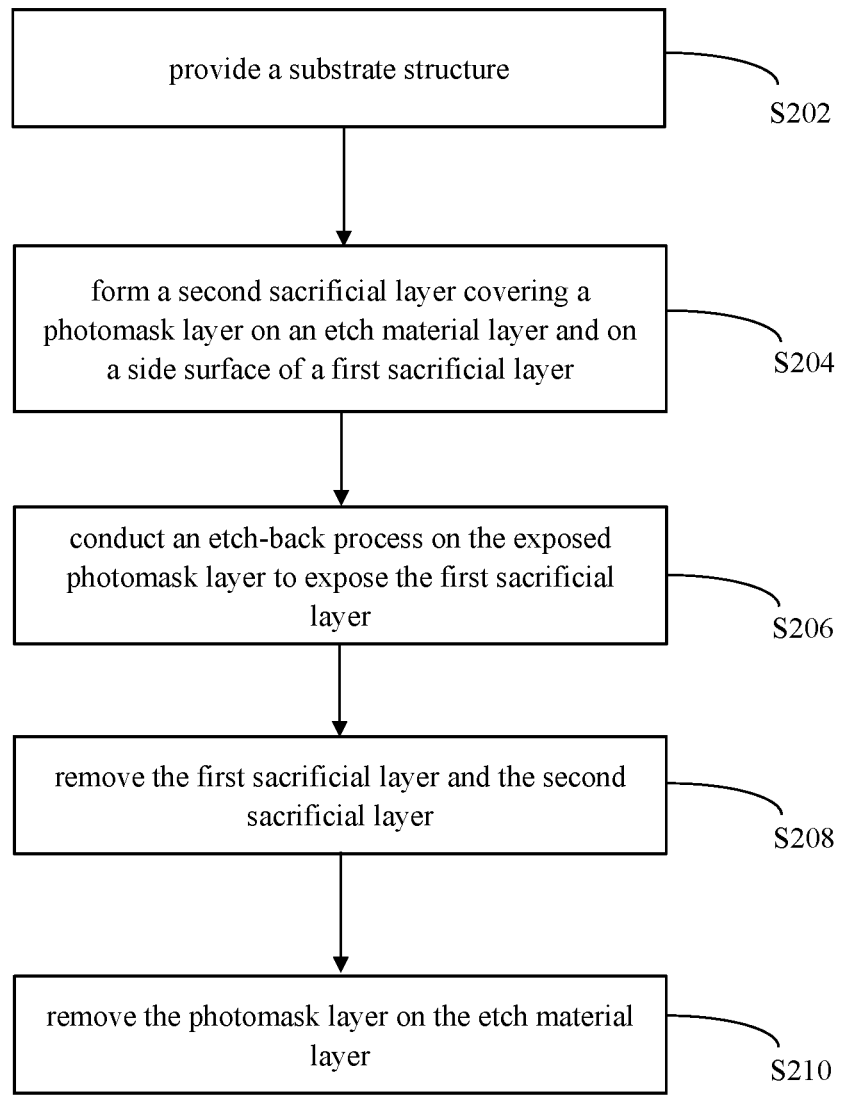
FIG. 2 shows a simplified flowchart illustrating a photomask manufacturing method in accordance with one or more embodiments of this inventive concept.

FIG. 2 shows a simplified flowchart illustrating a photomask manufacturing method in accordance with one or more embodiments of this inventive concept.

Referring to FIG. 2, in step 202, a substrate structure is provided.

Figure 3:
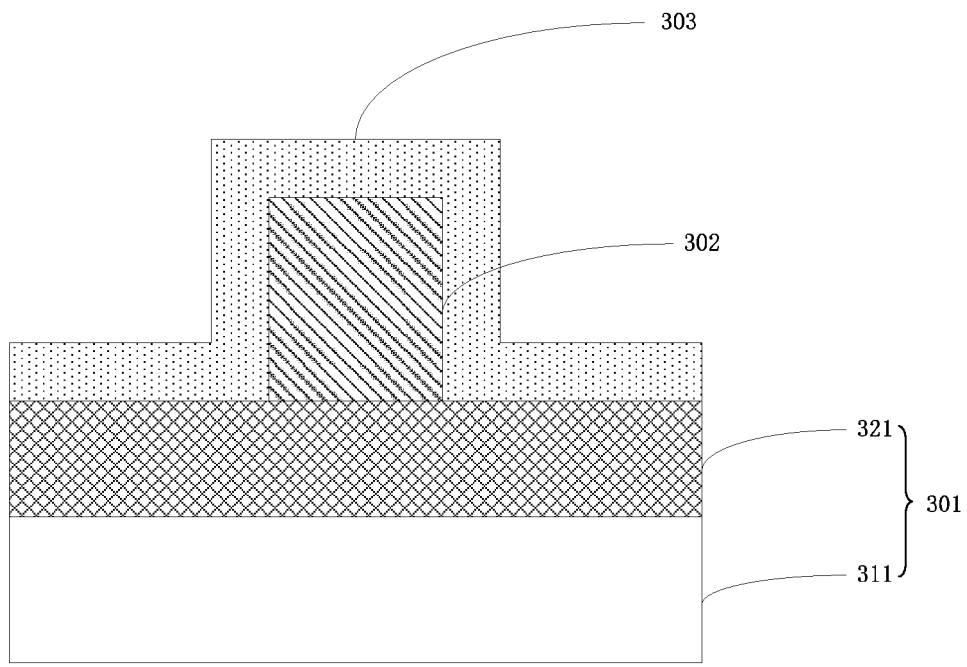
FIGS. 3, 4, 5, 6, 7, and 8 show schematic sectional views illustrating different stages of a photomask manufacturing method in accordance with one or more embodiments of this inventive concept.

FIG. 3 shows a schematic sectional view illustrating the substrate structure in a photomask manufacturing method in accordance with one or more embodiments of this inventive concept.

Referring to FIG. 3, the substrate structure comprises an etch material layer 301, a first sacrificial layer 302 on a portion of the etch material layer 301, and a photomask layer 303 on an upper surface of the etch material layer 301, an upper surface of the first sacrificial layer 302, and a side surface of the first sacrificial layer 302. The first sacrificial layer 302 may be made of poly-silicon and the photomask layer 303 may be made of a silicon nitride, a silicon oxide, or a silicon nitrogen.

Referring to FIG. 3, in one embodiment, the etch material layer 301 may comprise a semiconductor substrate 311 and a hard mask layer 321 on the semiconductor substrate 311. The semiconductor substrate 311 may be a silicon substrate, a germanium substrate, or a substrate of other semiconductor elements, it can also be a compound substrate such as a gallium arsenide (GaAs) substrate. The hard mask layer 321 may be made of a silicon oxide, a silicon nitride, or a silicon nitrogen. As an example, the hard mask layer 321 may be a multi-layer structure comprising a silicon nitride layer and a silicon oxide layer on the silicon nitride layer. This inventive concept is not limited herein though. In other embodiments, the etch material layer 301 may comprise only a semiconductor substrate or only a metal layer.

The substrate structure may be formed by the following process. First, the etch material layer 301 is provided, a sacrificial material layer is formed on the etch material layer 301, a patterned photoresist layer is formed on the sacrificial material layer. Then a first sacrificial layer 302 is formed by etching the sacrificial material layer using the patterned photoresist layer as a mask, and a photomask layer 303 is formed by depositing on the upper surface of the etch material layer 301, the upper surface of the first sacrificial layer 302, and the side surface of the first sacrificial layer 302. Atomic Layer Deposition (ALD) may be used to deposit the photomask layer 303. The etch material layer 301, the first sacrificial layer 302, and the photomask layer 303 constitute the substrate structure.

Referring to FIG. 2, in step 204, a second sacrificial layer is formed covering the photomask layer 303 on the etch material layer and the photomask layer 303 on the side surface of the first sacrificial layer.

Figure 4:
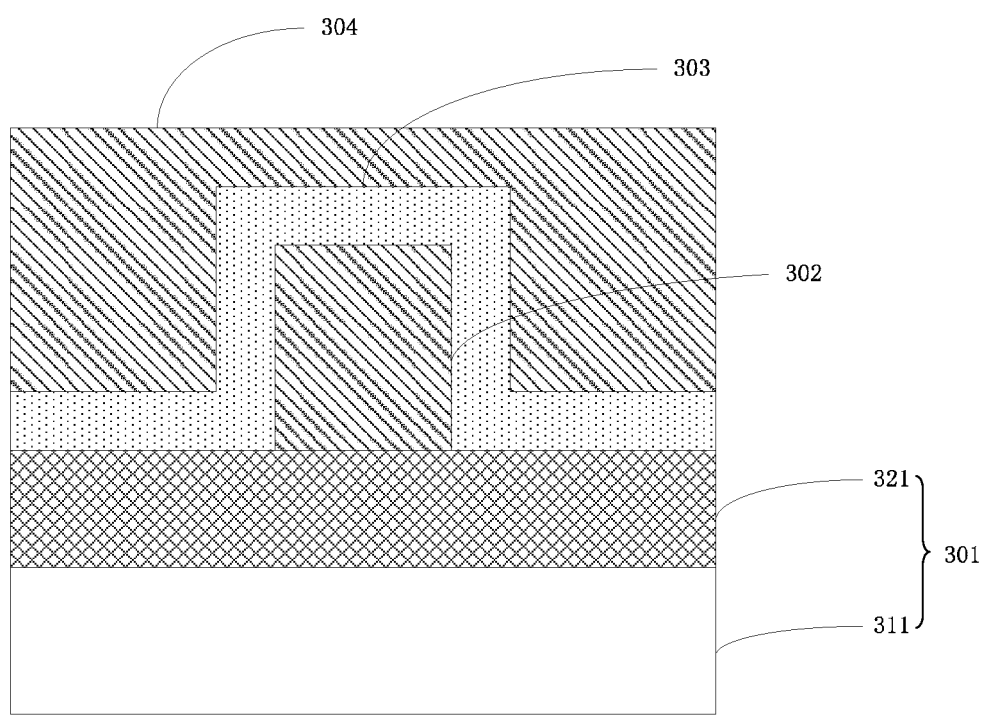
Figure 5:
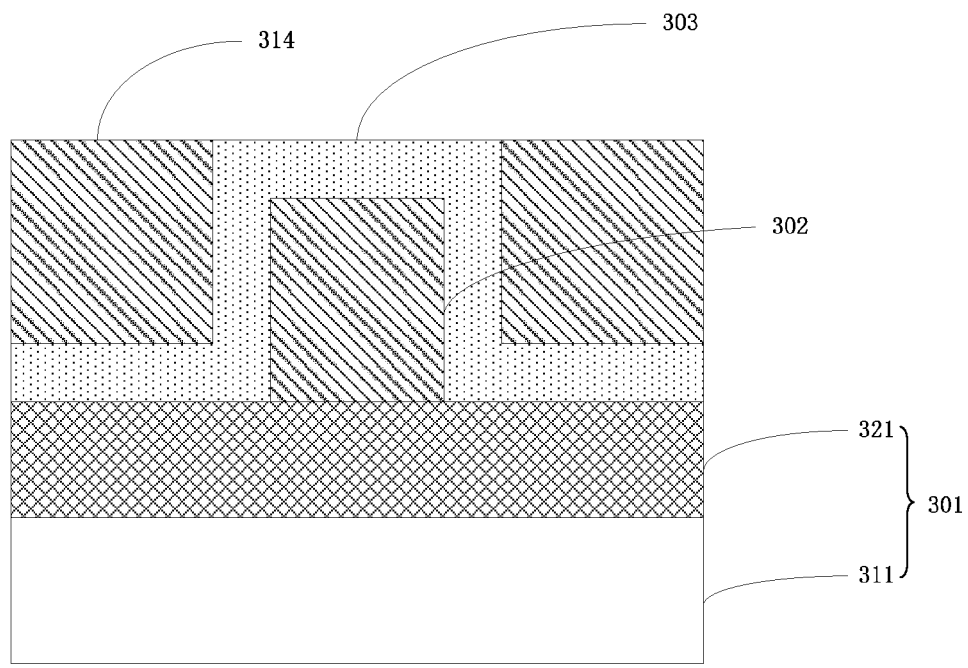

Referring to FIG. 4, in one embodiment, a sacrificial material layer 304 is first deposited on the substrate structure, then either a planarization process, such as Chemical Mechanical Polishing (CMP), or an etch-back process may be applied on the sacrificial material layer 304, so that an upper surface of the remaining sacrificial material layer 304 is on a substantial same horizontal level with an upper surface of the photomask layer 303 on the first sacrificial layer 302. That is, the upper surface of the photomask layer 303 on the first sacrificial layer 302 is exposed. Here, two surfaces are considered in a substantial same horizontal level if their position difference in the vertical direction is within a normal process variation. The remaining sacrificial material layer 304 will be annotated as a second sacrificial layer 314, as shown in FIG. 5. In one embodiment, the first sacrificial layer 302 and the second sacrificial layer 314 may be made of a same material, such as poly-silicon.

Figure 6:
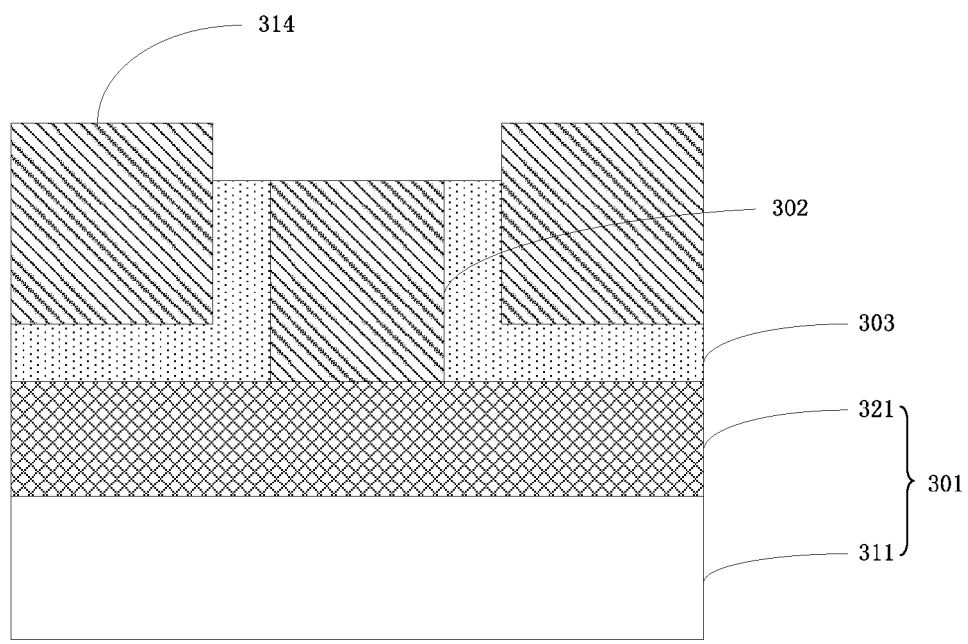

Referring to FIG. 6, in step 206, an etch-back process is applied on the photomask layer 303 to expose the first sacrificial layer 302. In one embodiment, the etch-back process on the photomask layer 303 may stop upon reaching the upper surface of the first sacrificial layer 302. In another embodiment, the etch-back process on the photomask layer 303 may remove a portion of the first sacrificial layer 302.

Figure 7:
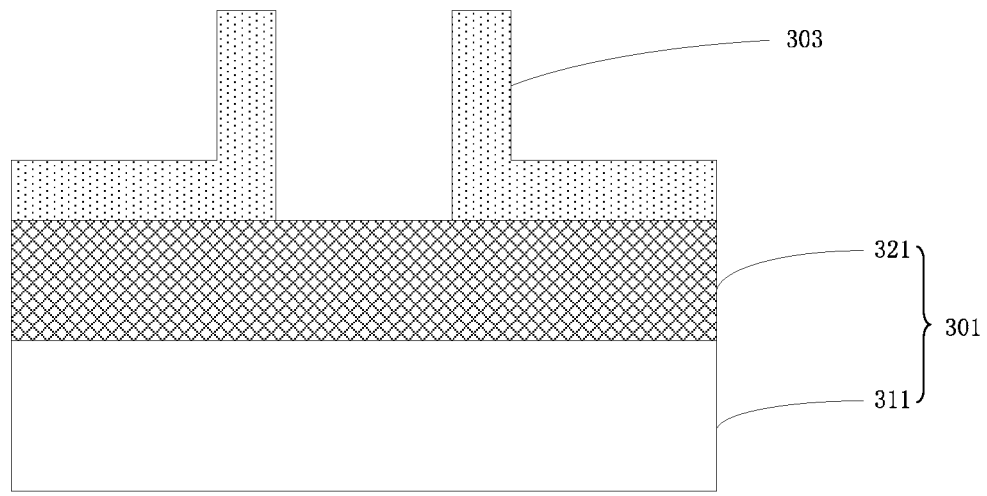

Referring to FIG. 7, in step 208, the first sacrificial layer 302 and the second sacrificial layer 314 are removed, they may be removed by, for example, a dry etching process.

Figure 8:
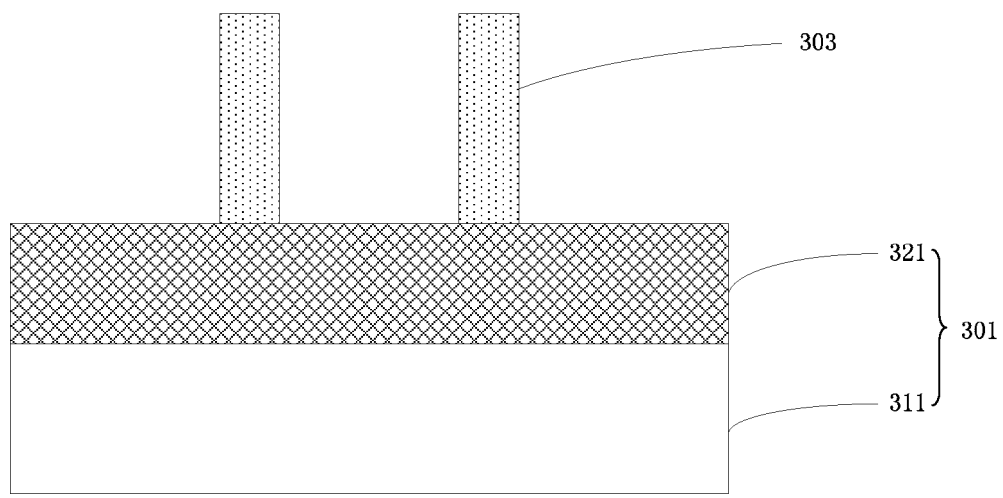

Referring to FIG. 8, in step 210, the photomask layer 303 on the etch material layer 301 is removed, and the remaining photomask layer 303, which is the photomask layer 303 originally on the side surface of the first sacrificial layer 302, is a photomask.

In one embodiment, the photomask layer 303 on the etch material layer 301 may be removed by an etch-back process. In another embodiment, it may also be removed by Direct Plasma Ribbon Etch. Direct Plasma Ribbon Etch only etches the material on one particular direction and has few effects on materials in other directions. As an example, Direct Plasma Ribbon Etch may be used to remove horizontally-oriented photomask layer 303 while retaining vertically-oriented photomask layer 303.

In some embodiments, while removing the photomask layer 303 on the etch material layer 301, the photomask layer 303 originally on the side surface of the first sacrificial layer 302 may also be partially removed and become lower.

In this photomask manufacturing method, the second sacrificial layer is formed on the photomask layer on the etch material layer. After the photomask layer on the first sacrificial layer is removed, both the first sacrificial layer and the second sacrificial layer are removed, and there would be no sacrificial layer on either side of the photomask layer originally on the side surface of the first sacrificial layer. As a result, even though the photomask layer originally on the side surface of the first sacrificial layer may be partially etched when removing the photomask layer on the etch material layer, the etching is symmetrical on both sides and the resulting photomask will have a substantially symmetrical shape, this is an improvement over conventional manufacturing methods.

After the photomask (that is, the remaining photomask layer 303 as shown in FIG. 8) is formed, it can be used as a mask to etch the etch material layer 301.

Figure 9:
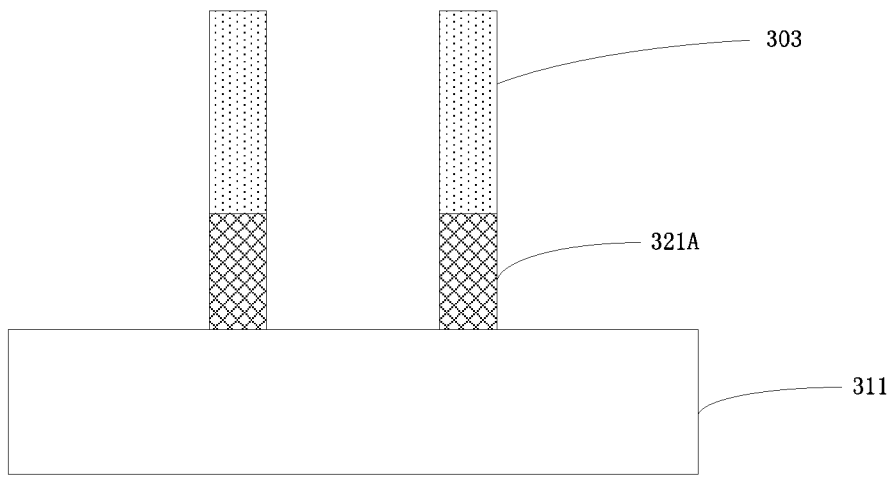
FIGS. 9 and 10 show schematic sectional views illustrating an etching process on an etch material layer in accordance with one or embodiments of this inventive concept.
Figure 10:
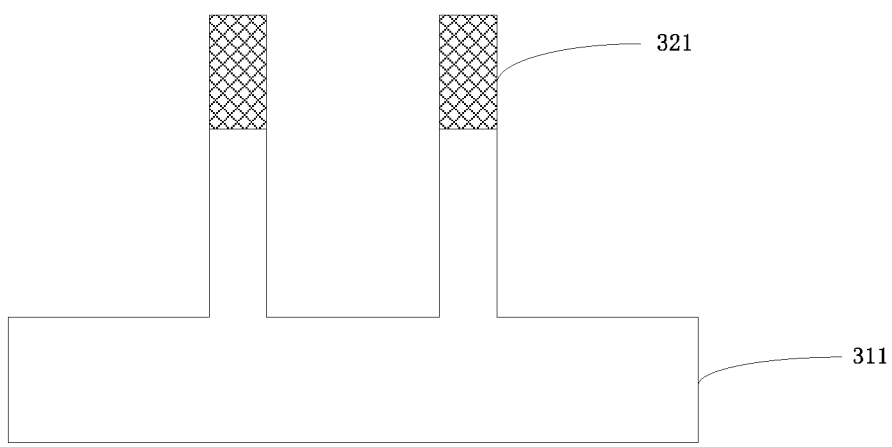

Referring to FIG. 9, in one embodiment, a patterned hard mask layer 321A may be formed by etching the hard mask layer 321 using the remaining photomask layer 303 (the photomask) as a mask. Then, referring to FIG. 10, the remaining photomask layer 303 is removed and semiconductor fins may be formed by etching the semiconductor substrate 311 using the patterned hard mask layer 321A as a mask. Since the remaining photomask layer 303 has a substantial symmetrical shape, the semiconductor fins will also have a more uniform and symmetrical shape than that from conventional methods.

Figure 11:
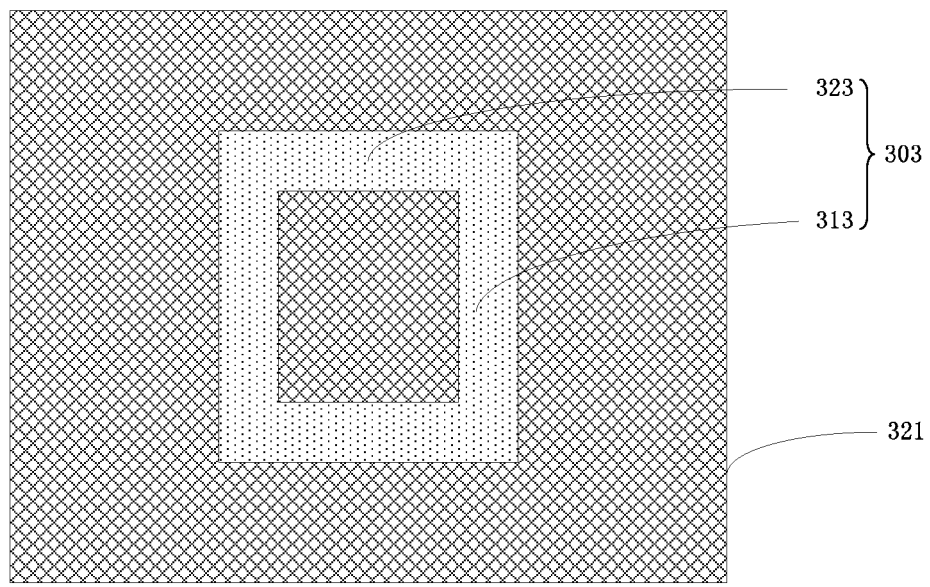
FIG. 11 shows a plan view of a photomask of a rectangular ring shape in accordance with one or more embodiments of this inventive concept.

In another embodiment, the side surface of the first sacrificial layer 302 may comprise a first side, a second side opposite to the first side, a third side, and a fourth side opposite to the third side. In that scenario, after the photomask layer 303 on the etch material layer 301 is removed, the remaining photomask layer 303 forms a photomask of a rectangular ring shape, as shown in FIG. 11. The photomask layer on the first and the second sides of the first sacrificial layer 302 is annotated as a first photomask layer 313, and the photomask layer on the third and the fourth sides of the first sacrificial layer 302 is annotated as a second photomask layer 323. The rectangular ring shape shown in FIG. 11 is but one example of possible photomask shapes of this inventive concept, the photomask may have other shapes, for example, it may have a rectangular ring shape with curved corners.

Figure 12:
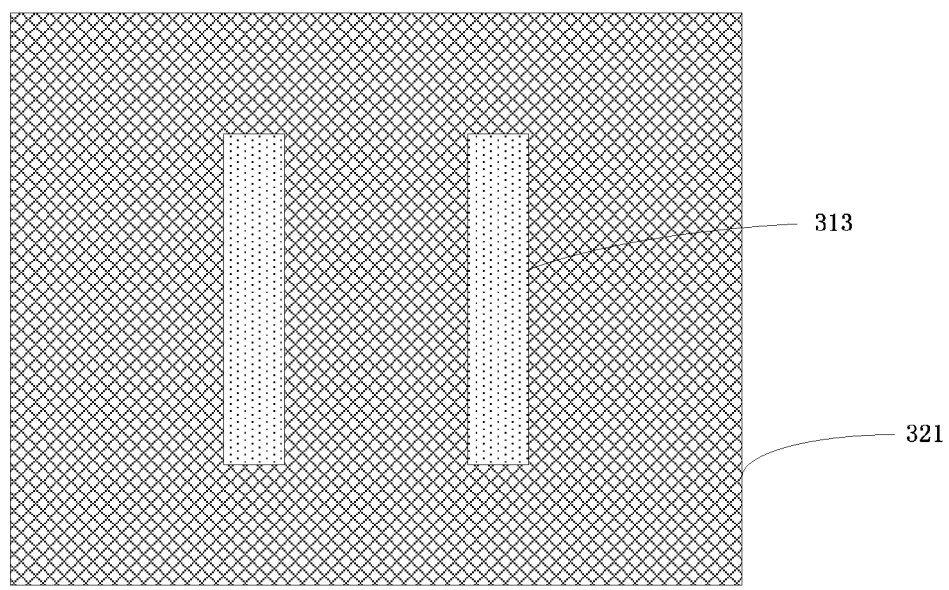
FIG. 12 shows a plan view of a bar-shaped photomask in accordance with one or more embodiments of this inventive concept.

To get a bar-shaped photomask, one of the first photomask layer 313 and the second photomask layer 323 will be removed after the photomask layer 303 on the etch material layer 301 is removed. FIG. 12 shows a plan view of a bar-shaped photomask after the photomask layer 303 on the third and the fourth sides of the first sacrificial layer 302 (that is, the second photomask layer 323) is removed. Optionally, Direct Plasma Ribbon Etch may be used to remove the first photomask layer 313 or the second photomask layer 323. Since the first photomask layer 313 and the second photomask layer 323 have different orientations, Direct Plasma Ribbon Etch can remove one of them without affecting the other.

After one of the first photomask layer 313 or the second photomask layer 323 is removed, the remaining photomask layer can be used as a mask to etch the etch material layer 301 to form semiconductor fins. The remaining process to form semiconductor fins is similar to what has been described previously and is omitted for conciseness.

This concludes the description of a photomask manufacturing method in accordance with one or more embodiments of this inventive concept. While this inventive concept has been described in terms of several embodiments, there are alterations, permutations, and equivalents, which fall within the scope of this disclosure. It shall also be noted that there are alternative ways of implementing the methods and apparatuses of the inventive concept. Furthermore, embodiments may find utility in other applications. The abstract section is provided herein for convenience and, due to word count limitation, is accordingly written for reading convenience and shall not be employed to limit the scope of the claims. It is therefore intended that the claims be interpreted as including all such alterations, permutations, and equivalents.

What is claimed is:

1. A photomask manufacturing method, comprising:
providing a substrate structure, wherein the substrate structure comprises:
an etch material layer;
a first sacrificial layer on a portion of the etch material layer; and
a photomask layer on an upper surface of the etch material layer, an upper surface of the first sacrificial layer, and a side surface of the first sacrificial layer, wherein the side surface of the first sacrificial layer comprises a first side, a second side opposite to the first side, a third side, and a fourth side opposite to the third side;
forming a second sacrificial layer covering the photomask layer on the etch material layer and the photomask layer on the side surface of the first sacrificial layer;
etching the photomask layer not covered by the second sacrificial layer to expose the first sacrificial layer;
removing the first sacrificial layer and the second sacrificial layer;
removing the photomask layer on the etch material layer; and
removing the photomask layer on either the first and the second sides, or the third and the fourth sides of the first sacrificial layer.

2. The method of claim 1, wherein forming a second sacrificial layer comprises:
depositing a sacrificial material layer on the substrate structure; and
conducting a planarization process on the sacrificial material layer so that an upper surface of the remaining sacrificial material layer is on a substantially same horizontal level with an upper surface of the photomask layer on the first sacrificial layer, the remaining sacrificial material layer is the second sacrificial layer.

3. The method of claim 1, wherein forming a second sacrificial layer comprises:
depositing a sacrificial material layer on the substrate structure; and
conducting an etch-back process on the sacrificial material layer so that an upper surface of the remaining sacrificial material layer is on a substantially same horizontal level with an upper surface of the photomask layer on the first sacrificial layer, the remaining sacrificial material layer is the second sacrificial layer.

4. The method of claim 1, wherein the photomask layer on the etch material layer is removed by Directed Plasma Ribbon Etch.

5. The method of claim 1, wherein the photomask layer on the etch material layer is removed by an etch-back process.

6. The method of claim 1, wherein the photomask layer on either the first and the second sides, or the third and the fourth sides of the first sacrificial layer is removed by Directed Plasma Ribbon Etch.

7. The method of claim 1, wherein the etch material layer comprises a semiconductor substrate and a hard mask layer on the semiconductor substrate.

8. The method of claim 7, further comprising:
forming a patterned hard mask layer by etching the hard mask layer using the photomask layer as a mask; and
etching the semiconductor substrate using the patterned hard mask layer as a mask.

9. The method of claim 1, further comprising:
etching the etch material layer using the photomask layer as a mask.

10. The method of claim 1, wherein the first sacrificial layer and the second sacrificial layer are made of a same material.

11. The method of claim 1, wherein the first sacrificial layer and the second sacrificial layer are both made of poly-silicon, and the photomask layer is made of a silicon nitride, a silicon oxide, or a silicon nitrogen.

* * * * *